United States Patent
Dezfooliyan et al.

(10) Patent No.: US 10,594,269 B2
(45) Date of Patent: Mar. 17, 2020

(54) CREST FACTOR REDUCTION IN POWER AMPLIFIER CIRCUITS

(71) Applicant: GOODIX TECHNOLOGY INC., San Diego, CA (US)

(72) Inventors: Amir Dezfooliyan, San Diego, CA (US); Waleed Younis, San Diego, CA (US); Tobias Seifert, San Diego, CA (US); Gunnar Nitsche, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/057,822

(22) Filed: Aug. 8, 2018

(65) Prior Publication Data

US 2020/0052656 A1 Feb. 13, 2020

(51) Int. Cl.
*H04K 1/02* (2006.01)
*H03F 1/32* (2006.01)
(Continued)

(52) U.S. Cl.
CPC ............ *H03F 1/32* (2013.01); *H03F 3/245* (2013.01); *H04L 27/2623* (2013.01);
(Continued)

(58) Field of Classification Search
CPC ...... H03F 1/32; H03F 3/245; H03F 2200/165; H03F 2200/451; H03F 2200/66;
(Continued)

(56) References Cited

U.S. PATENT DOCUMENTS 9,042,434 B2 * 5/2015 Smart ............... H03H 17/0263
375/229
2002/0042253 A1 4/2002 Dartois
(Continued)

FOREIGN PATENT DOCUMENTS

| CN | 101640660 A | 2/2010 |
| CN | 102111368 A | 6/2011 |
| CN | 105009536 A | 10/2015 |

OTHER PUBLICATIONS

He, Xingjian, "The Clipping Method of CFR in Multi-carrier TD-SCDMA System". Chinese Master's Theses Full-text Database. Apr. 15, 2011, No. 04, ISSN: 1674-0246 pages.
(Continued)

*Primary Examiner* — Dhaval V Patel
(74) *Attorney, Agent, or Firm* — Kilpatrick Townsend & Stockton LLP

(57) ABSTRACT

Techniques are described for crest factor reduction in power amplifier circuits. For example, crest factor reduction can keep the peak signal level of a signal for transmission to below a peak threshold level associated with a power amplifier in the transmission path. The signal is received by the crest factor reduction system and clipped in accordance with the peak threshold level. Edge smoothing is then applied to the clipped signal to reduce out-of-band emissions. The edge smoothing is implemented by a moving average filter, such as a time-domain box filter. In some embodiments, a maximum operation or minimum operation is used to prevent signal peak regrowth after the filtering. Some embodiments also include various iteration loops to further improve crest factor reduction.

13 Claims, 7 Drawing Sheets

(51) Int. Cl.
*H04L 27/26* (2006.01)
*H03F 3/24* (2006.01)
*H04B 1/04* (2006.01)
*H03F 3/19* (2006.01)

(52) U.S. Cl.
CPC ............ *H04L 27/2626* (2013.01); *H03F 3/19* (2013.01); *H03F 2200/165* (2013.01); *H03F 2200/451* (2013.01); *H03F 2200/66* (2013.01); *H03F 2200/78* (2013.01); *H03F 2201/3236* (2013.01); *H04B 1/0475* (2013.01)

(58) Field of Classification Search
CPC ......... H03F 2200/78; H03F 2201/3236; H03F 3/19; H04L 27/2626; H04L 27/2623; H04B 1/0475
See application file for complete search history.

(56) References Cited

U.S. PATENT DOCUMENTS

2016/0261445 A1\* 9/2016 Ishikawa ............. H04L 27/2626
2018/0062898 A1\* 3/2018 Traverso ................. H04L 27/26
2018/0359126 A1\* 12/2018 Wang .................. H04L 27/2618

OTHER PUBLICATIONS

International Search Report dated May 8, 2019 in corresponding CN application(application No. PCT/CN2019/070711).
Extended European Search Report dated Oct. 7, 2019 in the corresponding EP application (application No. 19717209.1).
Zhancang Wang: "Envelope Tracking Power Amplifiers for Wireless Communications", Jan. 1, 2014 (Jan. 1, 2014), Artech House, USA, pp. 229-282.
Xilinx: "Moving Average", All Rights Reserved, Aug. 21, 2007 (Aug. 21, 2007 ), pp. 1-45, XP55623717.

\* cited by examiner

CREST FACTOR REDUCTION IN POWER AMPLIFIER CIRCUITS

FIELD OF THE INVENTION

The present invention relates generally to power amplifier circuits. More particularly, embodiments of the present invention relate to crest factor reduction in power amplifier circuits.

BACKGROUND OF THE INVENTION

Power amplifier circuits are commonly used in a variety of applications for a number of purposes, including to apply gain to a signal to generate an amplified output signal. For example, cellular telephone communications, high-speed data communications, and other applications typically include transmitters with power amplifiers. In some cases, it is desirable to ensure that signals are amplified by the power amplifier without distortion. For example, when the signal power exceeds a linear operating range of the power amplifier, distortion can result, which can be undesirable.

For example, many modern communications schemes generate time-domain signals that manifest a high Peak to Average Power Ratio (PAPR). For example, some modulation schemes can sum frequency components in a manner that results in a highly variable amplitude, resulting in a high PAPR in the transmitted signal. Such high-PAPR signals can be particularly prone to distortion when passed through a power amplifier, and many applications that include such high-PAPR signals can be particularly sensitive to the resulting distortion.

As such, it is typically desirable in such applications to mitigate distortion of high-PAPR signals in the power amplifier of the transmitter. Various conventional approaches are used to avoid such distortion. For example, some conventional approaches dynamically reduce the gain of the signal at the input to the power amplifier as the power of the signal increases, which can help ensure that the signal power does not exceed the linear operating range of the power amplifier. However, such approaches tend to appreciably reduce the efficiency of the power amplifier. Other conventional approaches use hard clipping to effectively keep the signal amplitude from exceeding a threshold limit. However, hard clipping can tend to produce hard edges in the signal, which can cause out-of-band emission in the transmission. Some such approaches can use filtering to smooth the hard edges produced by the hard clipping, but the filtering can have its own limitations. For example, some such filtering approaches are relatively complex, resulting in more expensive circuitry. Further, some such filtering approaches can still result is undesirable signal characteristics, such as by generating signal peak regrowth in excess of the threshold limit.

BRIEF SUMMARY OF THE INVENTION

Embodiments of the present invention provides circuits, devices, and methods for crest factor reduction in power amplifier circuits. Some embodiments operate in context of a power amplifier circuit that is part of a transmitter circuit employed to transmit signals having high Peak to Average Power Ratio (PAPR). For example, it is desirable for the crest factor reduction to keep the peak signal level of a signal for transmission to below a peak threshold level associated with a power amplifier in the transmission path. The signal is received by the crest factor reduction system and clipped in accordance with the peak threshold level. Edge smoothing is then applied to the clipped signal to reduce out-of-band emissions. The edge smoothing is implemented by a moving average filter, such as a time-domain box filter. In some embodiments, a maximum operation or minimum operation is used to prevent signal peak regrowth after the filtering. Some embodiments also include various iteration loops to further improve crest factor reduction.

According to one set of embodiments, a crest factor reduction system is provided. The system includes: an input node to receive an input data signal; an output node to output an output data signal; a clipper subsystem; a filter subsystem; and an output signal generator. The clipper subsystem is to generate, responsive to receiving a clipper input signal, a clipper output signal that is a clipped portion of the clipper input signal that exceeds a threshold peak level, the clipper subsystem having at least a first clipper mode in which the clipper subsystem is coupled with the input node, such that the clipper input signal is the input data signal. The filter subsystem is to generate, responsive to receiving a filter input signal, a filter output signal that is a function of an average of the filter input signal over a moving time window, the filter subsystem having at least a first filter mode in which the filter subsystem is coupled with the clipper subsystem, such that the filter input signal is the clipper output signal. The output signal generator is to generate the output data signal at the output node by subtracting the filter output signal from the input data signal.

According to another set of embodiments, a method is provided for crest factor reduction. The method includes: receiving an input data signal; clipping the input data signal with respect to a threshold peak level to obtain a clipped portion of the input data signal that exceeds the threshold peak level; generating a filter output signal by filtering the clipped portion of the input data signal by a moving average filter, such that the filter output signal is a function of an average of the clipped portion of the input data signal over a moving time window; and generating an output data signal by subtracting the filter output signal from the input data signal.

According to another set of embodiments, a transmitter system is provided. The system includes: a power amplifier to generate a transmission signal for transmission over a data channel as a function of applying gain to an output data signal, the power amplifier having an associated threshold peak level; and a crest factor reduction (CFR) system coupled with the power amplifier to generate the output data signal as a crest factor-reduced version of a received input data signal in accordance with the threshold peak level. The CFR system includes: means for clipping the input data signal with respect to the threshold peak level to generate a clipped portion of the input data signal; means for edge-smoothing the clipped portion of the input data signal by computing an average of the clipped portion of the input data signal over a moving time window; and means for generating the output data signal as a function of subtracting, from the input data signal, a signal corresponding to the average of the clipped portion of the input data signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
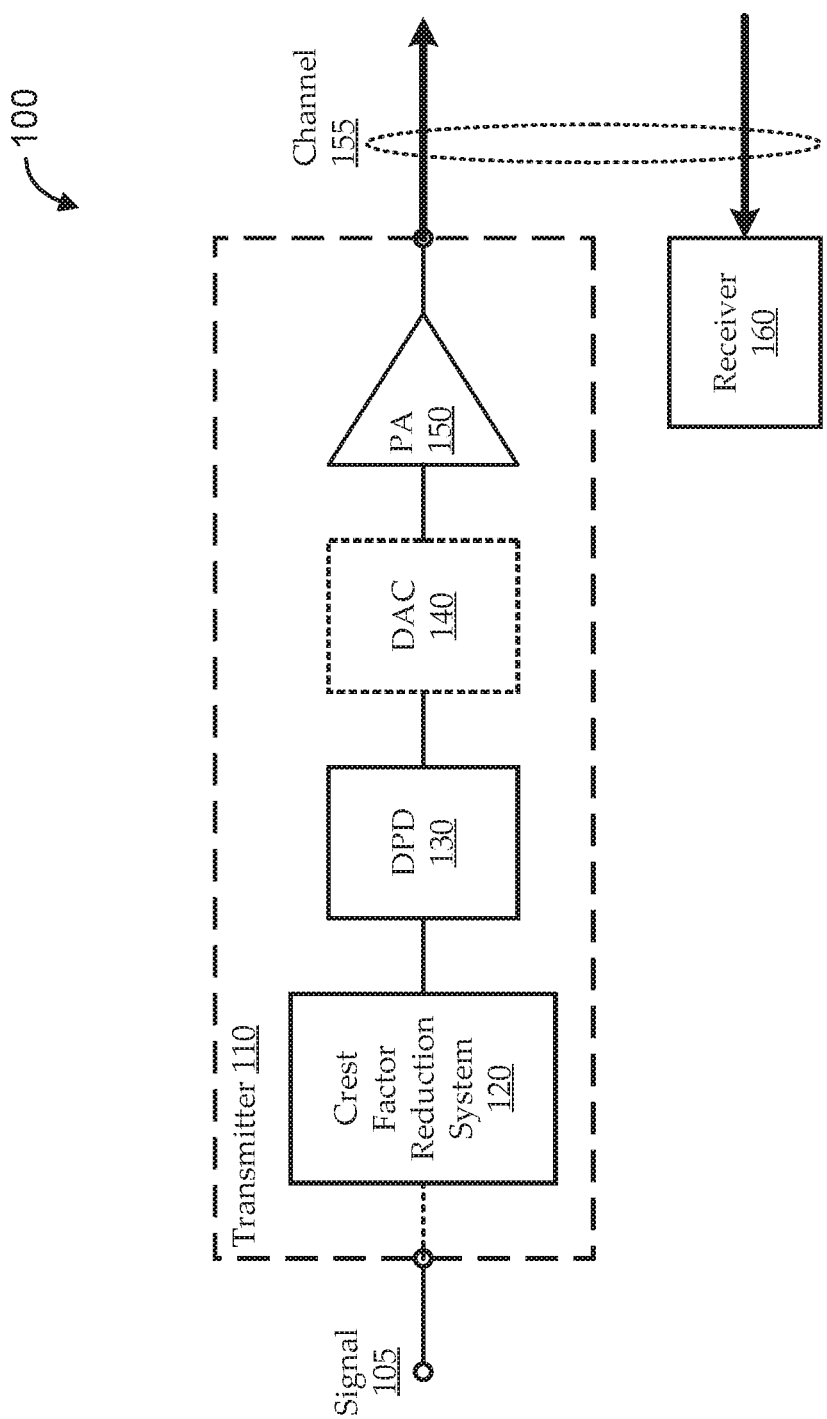
FIG. 1 shows an illustrative data communication environment, as a context for various embodiments.

FIG. 1 shows an illustrative data communication environment 100, as a context for various embodiments. The data communication environment 100 includes a transmitter 110 and a receiver 160 in communication with a channel 155. As illustrated, the transmitter 110 can receive a signal 105 and can prepare the signal 105 for transmission over the channel 155. Preparing the signal 105 can include passing the signal 105 through a number of components in a manner that amplifies the signal without introducing undesirable distortions and/or other artifacts. For example, the transmitter 110 can include some or all of a crest factor reduction system 120, a digital pre-distortion system 130, and a power amplifier 150.

For example, the signal 105 can be a time-domain signal having a relatively high Peak to Average Power Ratio (PAPR). For example, such a signal 105 can be typical of a modern communication system that uses certain types of modulation schemes that result in highly variable amplitudes in their transmitted signals. Such high-PAPR signals can be particularly prone to distortion when passed through a power amplifier (e.g., power amplifier 150), and many applications that include such high-PAPR signals can be particularly sensitive to the resulting distortion. As such, it is typically desirable in such applications to mitigate distortion of high-PAPR signals in the power amplifier 150 of the transmitter 110. Crest factor reduction can be used in such cases to reduce the signal 105 prior to amplification by the power amplifier 150 in a manner that reduces the PAPR to allow the power amplifier 150 can operate more efficiently.

In some embodiments, the signal 105 is received in a Cartesian domain and is converted to a polar-domain signal (i.e., represented by amplitude and phase). The crest factor reduction system 120 receives the polar-domain signal and generates an output signal having a reduced PAPR. If target PAPR for transmitted signal is denoted as P (in decibels), the maximum level for the transmitted signal, A, can be calculated as:

$$A = 10^{\frac{P}{20}} \sigma \quad (1)$$

where σ is the root mean square (RMS) of the input signal. To limit the peak of the transmitted signal to A, the crest factor reduction system 120 can employ clipping and edge smoothing, as described herein. The edge smoothing seeks to smooth sharp corners resulting from hard clipping, which can limit degradation from out-of-band emissions due to sharp corners.

For example, the hard clipping can be implemented by detecting instances in which the signal level of the signal 105 is higher than the target level A, as:

$$q[n] = \begin{cases} 0 & \text{if } x[n] \leq A \\ x[n] - A & \text{if } x[n] > A \end{cases} \quad (2)$$

A windowing function c [n] for hard clipping can be calculated as:

$$x_{CFR}[n] = x[n] - q[n] \quad (3)$$

where $x_{CFR}[n]$ is the reduced CFR with maximum peak level of A. To limit out-of-band emission degradation, edge smoothing can be performed using moving average filtering. For example, a time-domain box filter can generate a moving average of the clipped signal. A maximum operation can be applied after the moving average to limit signal regrowth after the smoothing operation. In some implementations, edge smoothing and/or other portions of the crest factor reduction can be iterated to improve smoothing.

Embodiments described herein include a number of novel approaches to implementing the crest factor reduction system 120. For example, embodiments of the crest factor reduction system 120 can include means for clipping the input signal 105 with respect to a threshold peak level to generate a clipped portion of the input signal 105; means for edge-smoothing the clipped portion of the input signal 105 by computing an average of the clipped portion of the input signal 105 over a moving time window; and means for generating a reduced signal as a function of subtracting, from the input signal 105, a signal corresponding to the average of the clipped portion of the input data signal.

The reduced signal can then be passed to the digital pre-distortion system 130, which can effectively model distortion anticipated to be caused by the power amplifier 150, and can alter the reduced signal to pre-compensate for that anticipated distortion. Accordingly, the crest factor reduction system 120 and the digital pre-distortion system 130 can condition the signal 105 so that the power amplifier 150 can operate with higher power efficiency and less distortion. In some embodiments, a polar-domain power amplifier 150 can be used directly to amplify the polar-domain signal output by the digital pre-distortion system 130. Other embodiments can include a digital to analog converter (DAC) 140 and/or other components for use with other types of power amplifiers 150. For example, implementations can convert the output of the digital pre-distortion system 130 back to Cartesian domain, pass the Cartesian-domain signal to a DAC 140 for conversion to an analog signal, and can use an analog power amplifier 150 to apply gain to the analog signal.

Figure 2:
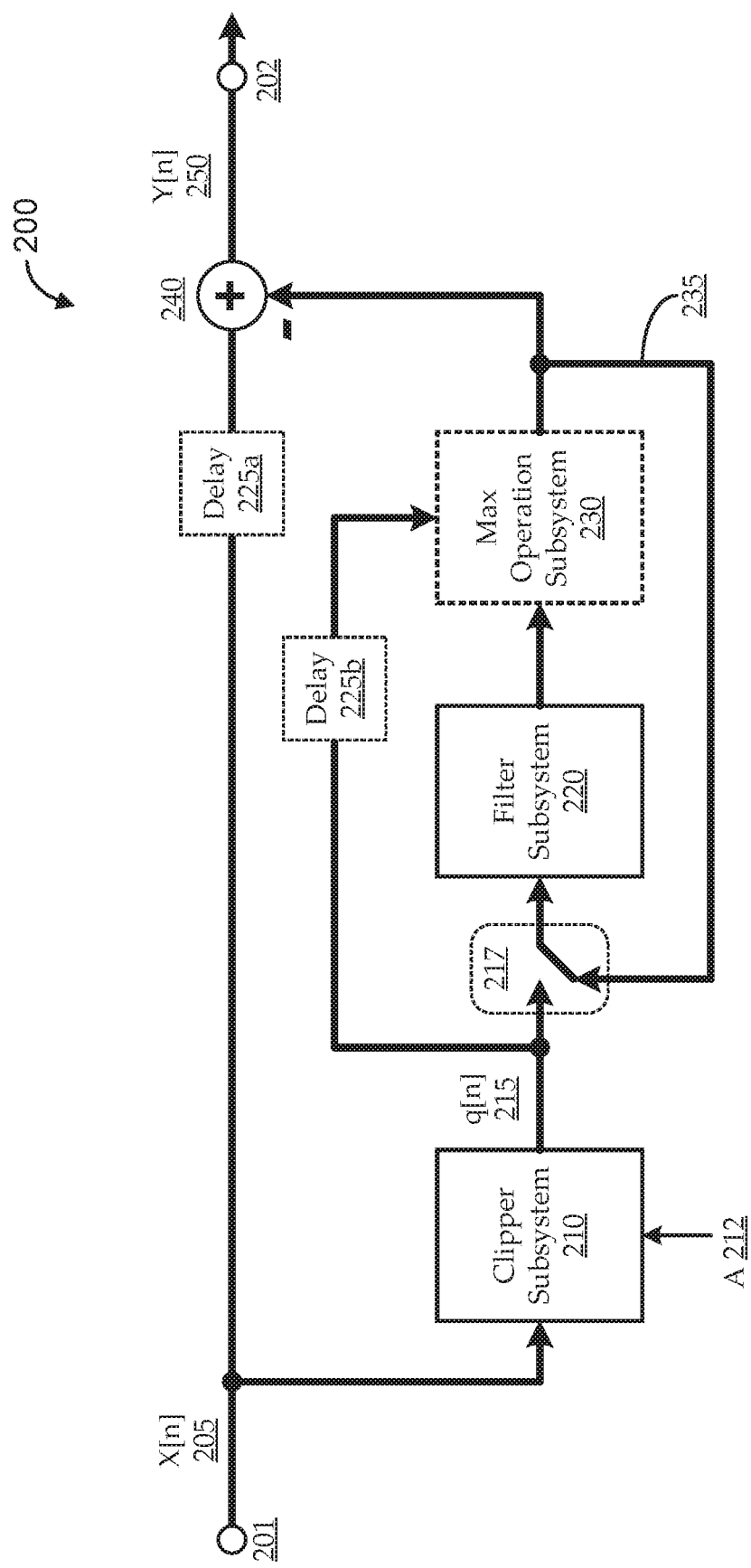
FIG. 2 shows an illustrative crest factor reduction system, according to various embodiments.

FIG. 2 shows an illustrative crest factor reduction system 200, according to various embodiments. The crest factor reduction system 200 can include an input node 201 to receive an input data signal (X[n]) 205, and an output node 202 to output an output data signal (Y[n]) 250. Coupled between the input node 201 and the output node 202 can be a clipper subsystem 210, a filter subsystem 220, and an output signal generator 240.

Embodiments of the clipper subsystem 210 receive an generate, responsive to receiving a clipper input signal, a clipper output signal (q[n]) 215 that is a clipped portion of the clipper input signal that exceeds a threshold peak level (A) 212. For example, the clipper subsystem 210 can effectively implement Equation (2) recited above. Some embodiments of the clipper subsystem 210 are implemented as a digital high-pass filter that passes through any samples of the input data signal 205 having an amplitude in excess of A 212. In the illustrated embodiment, the input of the clipper subsystem is coupled with the input node 201, such that the clipper input signal is the input data signal 205, and the output of the clipper subsystem 210 is a clipped portion of the input data signal 205. For example, wherever the level of the input data signal 205 exceeds A 212, the output of the clipper subsystem 210 corresponds to that excess (e.g., to the absolute value of the signal level of the input data signal 205 less A 212); and the output of the clipper subsystem 210 is 0 otherwise (i.e., wherever the level of the input data signal 205 is less than A 212).

Figure 4:
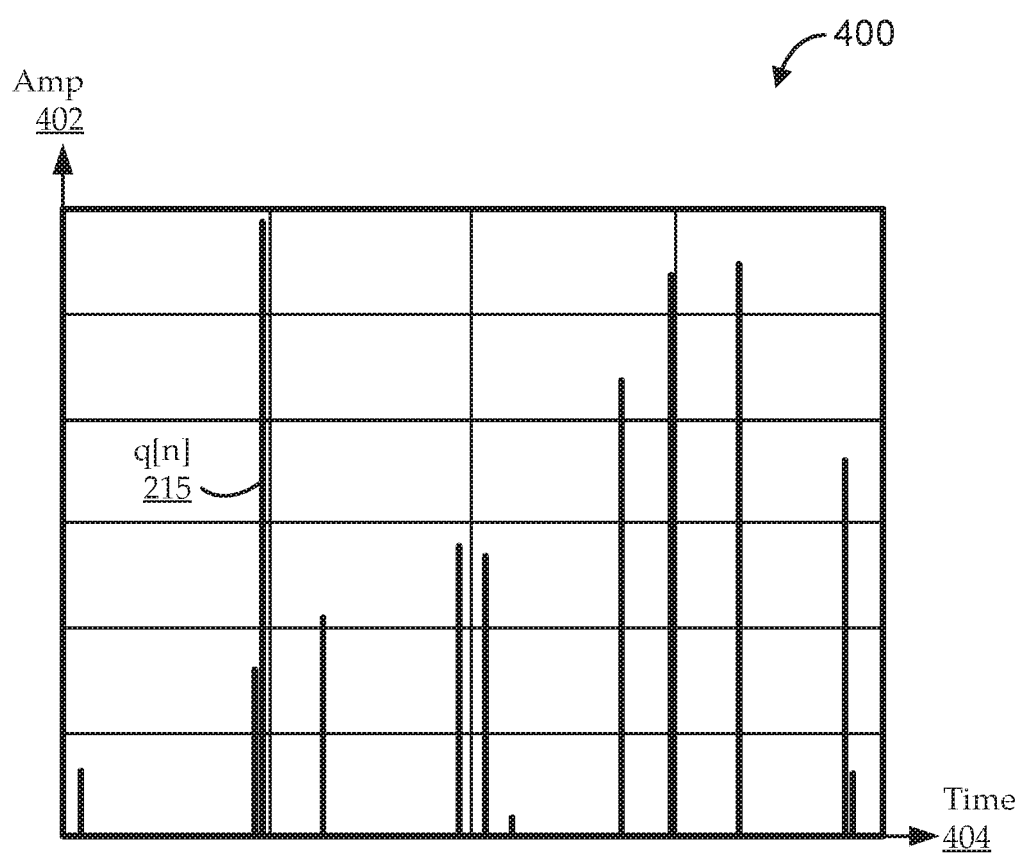
FIG. 4 shows an example plot of amplitude versus time for an illustrative clipper output signal.

For the sake of illustration, FIG. 4 shows an example plot 400 of amplitude 402 versus time 404 for an illustrative clipper output signal 215. For example, the plot 400 can be for a target PAPR (i.e., a threshold peak level 212) of 4 dB for a 12-tone transmission. As illustrated, the clipper output signal 215 is zero in most locations, as the input data signal 205 only tends to exceed the threshold peak level 212 in few instances.

Returning to FIG. 2, embodiments of the filter subsystem 220 generate, responsive to receiving a filter input signal, a filter output signal that is a function of an average of the filter input signal over a moving time window. Some embodiments of the filter subsystem 220 are implemented as a time-domain box filter. For example, at any particular time, the moving time window defines a temporal range that includes M samples of the filter input signal (e.g., of the portion of the input data signal 205 exceeding the threshold peak level 212), where M is a positive integer (e.g., eight). For each particular time, the filter subsystem 220 (e.g., the time-domain box filter) computes the average by computing a sum of the M samples, and effectively dividing by M. Some implementations avoid using complex circuitry to perform the division by exploiting powers of two. For example, in such implementations, M can equal $2^N$, where N is a positive integer (i.e., the number of samples is a power of two). Getting rid of the N least significant bits from the sum effectively divides by M, thereby yielding the average of the filter input signal for the particular time. As an example, where N is three, the filter length of the filter subsystem 220 is eight. Getting rid of the three least significant bits of the sum of eight samples effectively divides the sum by eight, thereby yielding the average without using complex circuitry to perform the division.

Embodiments of the output signal generator 240 can generate the output data signal 250 at the output node 202 by subtracting the filter output signal from the input data signal 205. In some embodiments, the output signal generator 240 is implemented as a summer that takes the input data signal 205 and the complement of the filter output signal as its inputs, and outputs the output data signal 250 as the sum of those input signals. Some implementations of the filter subsystem 220 introduce delay into the crest factor reduction system 200. Moving average filtering averages past and future samples, thereby introducing a so-called group delay. In some cases, the group delay can be (F−1)/2, where F is the filter length. As such, components of the crest factor reduction system 200 that operate on signals both before and after the filter subsystem 220 can include delay components 225 to account for the delay introduced by the filter subsystem 220 and effectively time-align the signals. For example, embodiments of the output signal generator 240 include a delay component 225a to delay receipt of the input data signal 205 according at least to the group delay of the filter subsystem 220 to generate a delayed input data signal. In such embodiments, the output signal generator 240 generates the output data signal 250 by subtracting the filter output signal from the delayed input data signal. In that way, the subtraction can be performed on time-aligned signals.

Some embodiments of the crest factor reduction system 200 further include a maximum operation subsystem 230 to limit signal peak regrowth after edge smoothing. For example, without such a maximum operation subsystem 230, the signal level of the filter output signal can tend to regrow in excess of the threshold peak level 212. To keep the edge-smoothing output below the threshold peak level 212, the maximum operation subsystem 230 can compute a maximum of the filter output signal with respect to the clipper output signal 215. Though shown as a separate component, some embodiments of the maximum operation subsystem 230 can be implemented as part of the filter subsystem 220. For example, the filter subsystem 220 can include a moving average filter to generate a moving average signal that is the average of the clipped portion of the filter input signal over the moving time window; and a maximum operation subsystem 230 to receive the moving average signal and the clipper output signal 215, and to generate the filter output signal by computing a maximum of the moving average signal with respect to the clipper output signal 215. Some embodiments of the maximum operation subsystem 230 are implemented as a comparator having a first comparator input coupled with the moving average signal, a second comparator input coupled with the clipper output signal 215, and a comparator output that is the maximum of the first and second comparator inputs. As described above, implementations of the filter subsystem 220 can introduce a delay (e.g., the group delay). As such, some implementations include a delay component 225b to delay receipt by the maximum operation subsystem 230 of the clipper output signal 215 according to the delay of the filter subsystem 220 to generate a delayed clipped portion, such that the maximum is computed with respect to the delayed clipped portion.

Figure 5:
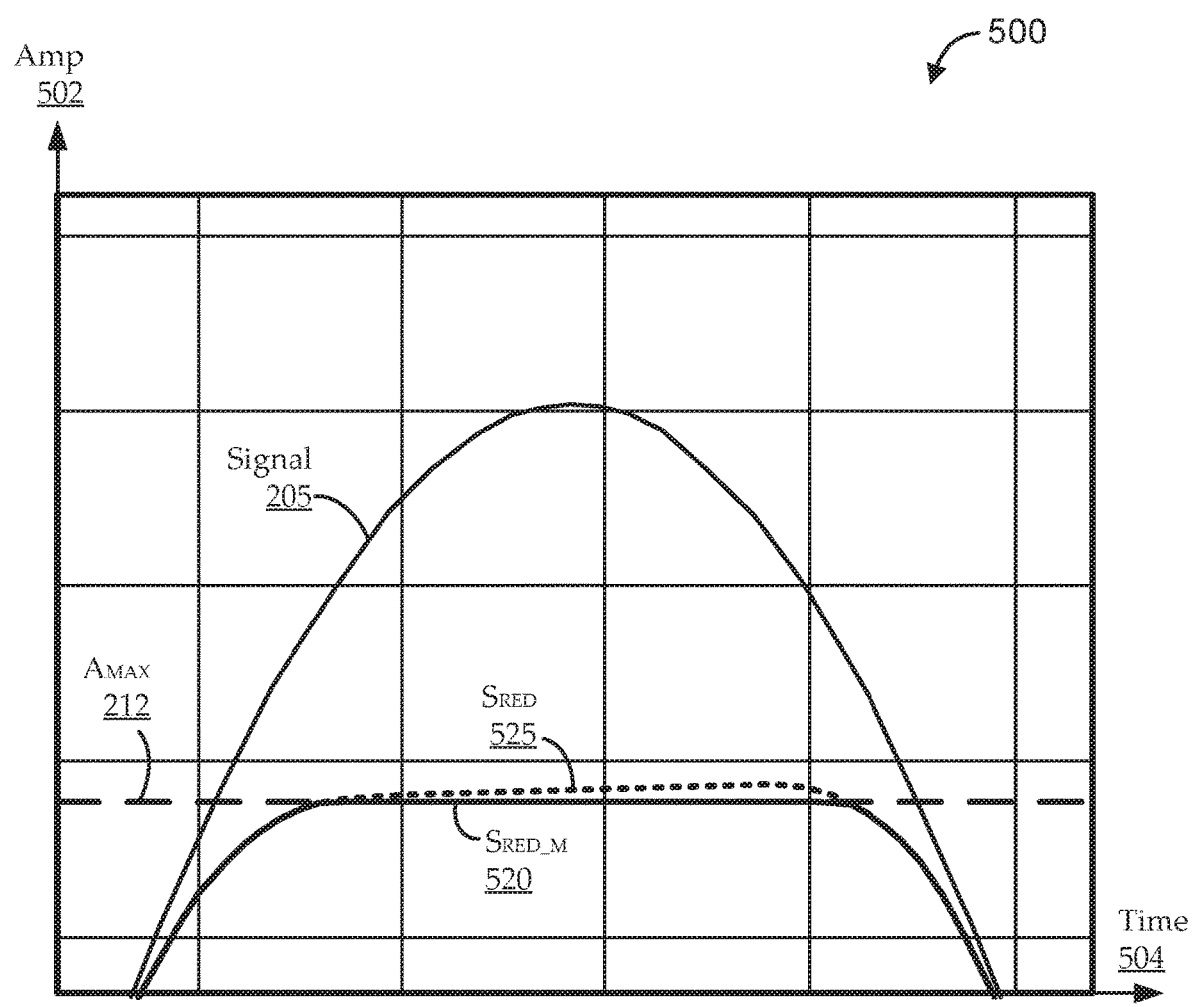
FIG. 5 shows a plot of amplitude versus time for various simplified signals to demonstrate the effect of the maximum operation subsystem.

For the sake of illustration, FIG. 5 shows a plot 500 of amplitude 502 versus time 504 for various simplified signals to demonstrate the effect of the maximum operation subsystem 230. The illustrated signals include a portion of an illustrative input data signal 205 plotted in context of an illustrative threshold peak level (A) 212, a version of the output data signal 250 generated without a maximum operation subsystem 230 (illustrated as $S_{RED}$ 525), and a version of the output data signal 250 generated with a maximum operation subsystem 230 (illustrated as $S_{RED\_M}$ 520). The illustrated $S_{RED}$ 525 exhibits signal peak regrowth after the clipping and smoothing, such that much of the reduced output data signal 250 still exceeds the threshold peak level 212. In contrast, the illustrated $S_{RED\_M}$ 520 stays at or below the threshold peak level 212 because of the maximum operation subsystem 230.

Returning again to FIG. 2, in some embodiments, edge smoothing can be improved by iteratively passing one or more signals through one or more components of the crest factor reduction system 200. For example, as illustrated, some embodiments of the filter subsystem 220 selectively operate in multiple filter modes. Some embodiments include a state controller 217 that can selectively switch between the filter modes by coupling the input of the filter subsystem 220 with different signals at different times. For example, the state controller 217 can be implemented as a processor, state machine, or any other suitable controller that directs operation of one or more switches. In the illustrated embodiment, the state controller 217 can selectively couple the input of the filter subsystem 220 either to the output of the clipper subsystem 210 or to a feedback iteration loop 235. The feedback iteration loop 235 can be coupled with the output of the filter subsystem 220 (e.g., with or without the maximum operation subsystem 230). For example, the filter subsystem 220 can output the filter output signal iteratively by generating the filter output signal as a function of the clipper output signal 215 in one iteration, and using the generated filter output signal from the one iteration to regenerate the filter output signal as a function thereof in subsequent iterations.

Figure 6:
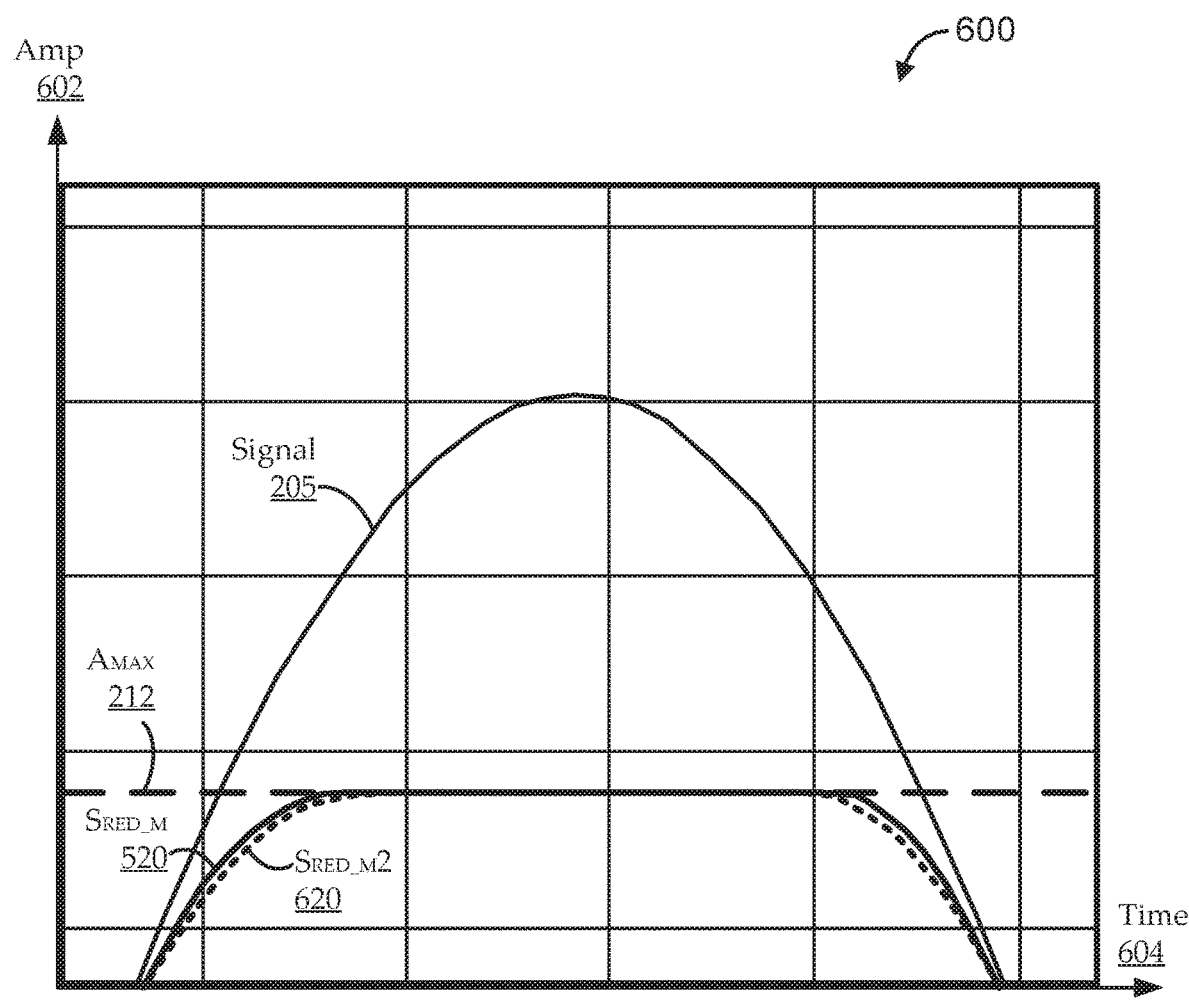
FIG. 6 shows a plot of amplitude versus time for various simplified signals to demonstrate the effect of using iteration.

For the sake of illustration, FIG. 6 shows a plot 600 of amplitude 602 versus time 604 for various simplified signals to demonstrate the effect of using iteration. The illustrated signals include a portion of an illustrative input data signal 205 plotted in context of an illustrative threshold peak level (A) 212, a version of the output data signal 250 generated with a single iteration (illustrated as $S_{RED\_M}$ 520, which can correspond to $S_{RED\_M}$ 520 of FIG. 5), and a version of the output data signal 250 generated with two iterations (illustrated as $S_{RED\_M}2$ 620). The illustrated $S_{RED\_M}2$ 620 exhibits more edge smoothing than the illustrated $S_{RED\_M}$ 520.

Figure 3:
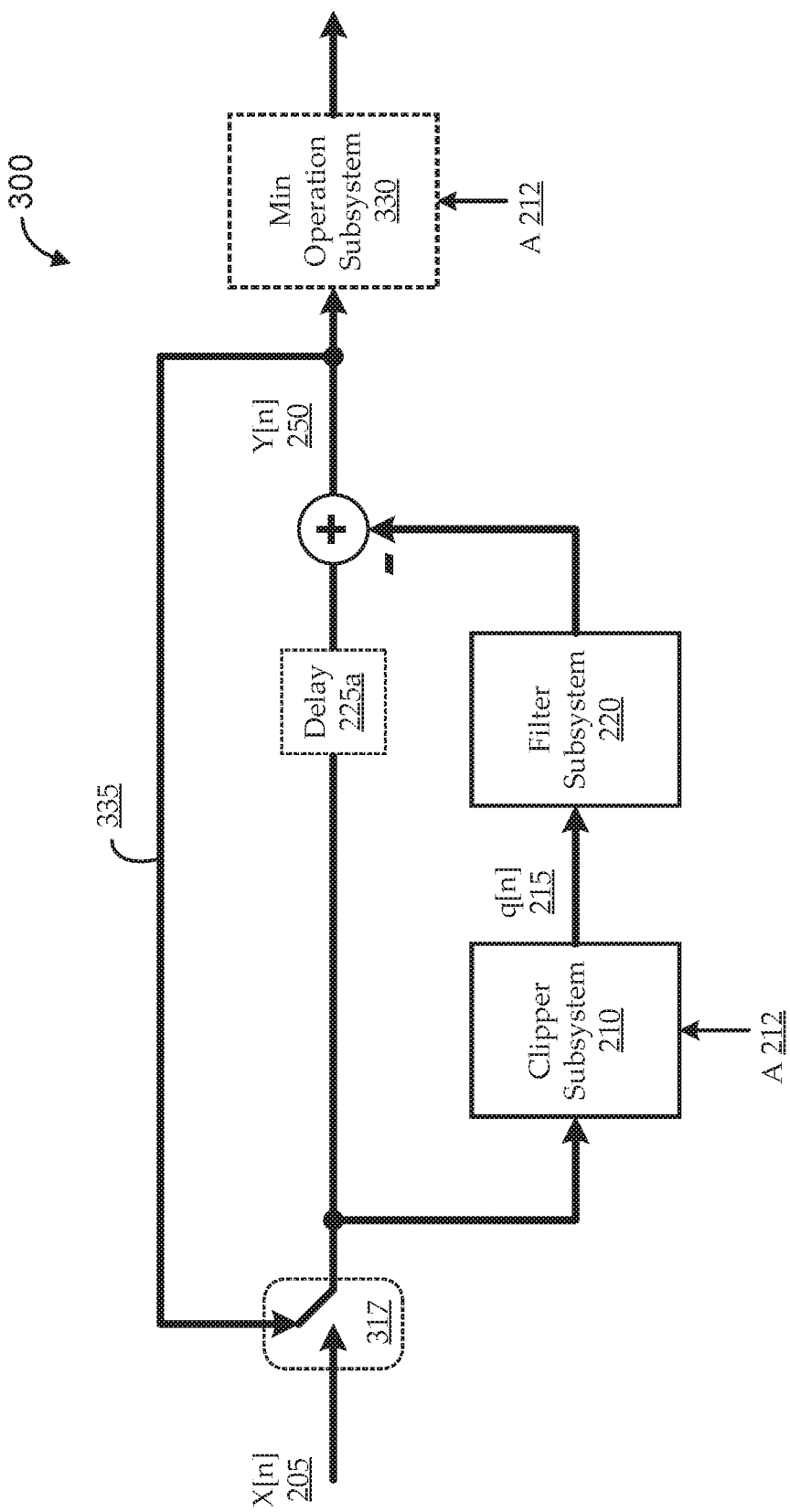
FIG. 3 shows another illustrative crest factor reduction system having a different configuration from that of FIG. 2, according to various embodiments.

The embodiments described above with reference to FIG. 2 (and FIGS. 4-6) include only some of many possible embodiments for implementing novel features described herein. Some other embodiments are illustrated in FIG. 3. For example, various embodiments described with reference to FIG. 3 illustrate architectures that support different types of iteration. Each such architecture can provide certain features and may or may not be combinable with others of the architectures. Further, such differences in architecture can result in other components differences. For example, different types of iterations can result in different amounts of delay introduced into different signal paths, such that one or more delay components 225 can be adapted accordingly. For the sake of clarity, portions of FIG. 3 that are similar to components of FIG. 2 are labeled with corresponding reference numbers.

FIG. 3 shows another illustrative crest factor reduction system 300 having a different configuration from that of FIG. 2, according to various embodiments. The crest factor reduction system 300 can operate with generally the same components, and in generally the same manner, as those of FIG. 2; except that the state controller 317 and the feedback iteration loop 335 are different from corresponding components of FIG. 2. As illustrated, the state controller 317 can be configured to direct multiple output modes of the crest factor reduction system 300 by selectively altering multiple signal paths at different times. In some implementations, in a first output mode, the state controller 317 selectively couples an input of the output signal generator 240 and an input of the clipper subsystem 210 both to the input node 205; and in a second output mode, the state controller 317 couples the input of the output signal generator 240 and the input of the clipper subsystem 210 both to the output of the output signal generator 240. For example, the state controller 317 can be implemented to direct operation according to the first output mode in a first iteration, and to direct operation according to the second output mode in one or more subsequent iterations.

As illustrated, some embodiments can further include a minimum operation subsystem 330. Embodiments of the minimum operation subsystem 330 can compute a minimum with respect to the threshold peak level 212. In some embodiments, the minimum operation subsystem 330 is a component of the output signal generator 240. For example, the output signal generator 240 can include a summer to generate a pre-output data signal by subtracting the filter output signal from the input data signal 205, and minimum operation subsystem 330 can generate the output data signal 250 by computing a minimum of the pre-output data signal with respect to the threshold peak level 215. For example, embodiments of the minimum operation subsystem 330 can be implemented as a comparator having a first comparator input coupled with the pre-output data signal, a second comparator input coupled with the threshold peak level 215, and a comparator output that is the minimum of the comparator inputs.

Figure 7:
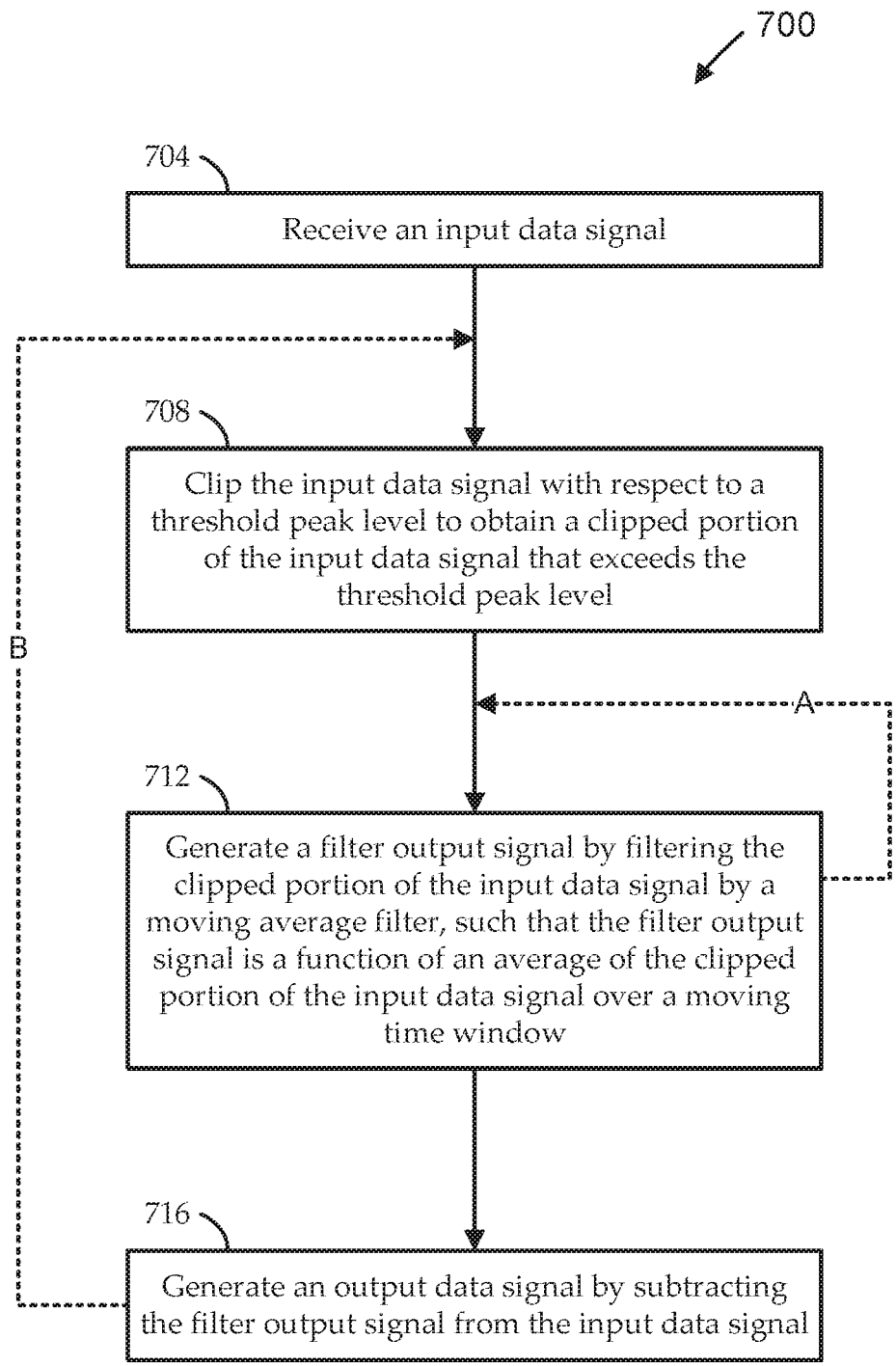
FIG. 7 shows a flow diagram of an illustrative method for crest factor reduction in a power amplifier circuit, according to various embodiments.

FIG. 7 shows a flow diagram of an illustrative method 700 for crest factor reduction in a power amplifier circuit, according to various embodiments. Embodiments of the method 700 can be implemented using any suitable system, including, but not limited to, those described above. Embodiments of the method begin at stage 704 by receiving an input data signal. For example, embodiments can be implemented by a transmitter in communication with a data channel. The transmitter is to receive the input data signal and prepare the data signal for transmission over the data channel, for example, by using a power amplifier to amplify the data signal, etc. As described herein, embodiments of the method 700 seek to perform crest factor reduction on the input data signal to reduce distortion and/or other undesirable artifacts potentially introduced into the signal path by the power amplifier (e.g., particularly in context of signals having relatively high PAPR).

At stage 708, embodiments can clip the input data signal with respect to a threshold peak level to obtain a clipped portion of the input data signal that exceeds the threshold peak level. At stage 712, embodiments can generate a filter output signal by filtering the clipped portion of the input data signal by a moving average filter, such that the filter output signal is a function of an average of the clipped portion of the input data signal over a moving time window. In some embodiments, generating the filter output signal at stage 712 includes filtering the clipped portion of the input data signal by the moving average filter to generate a moving average signal that is the average of the clipped portion of the input data signal over the moving time window, and generating the filter output signal by computing a maximum of the moving average signal with respect to the clipped portion of the input data signal.

Some embodiments can include adding delay to one or more signals to effectively time-align signals, as appropriate. The moving average filter can have an associated group delay (e.g., $(F-1)/2$, where F is the filter length), and certain computations performed in stages of the method 700 can involve delaying one or more signals with respect to the group delay. For example, in embodiments described above that compute a maximum as part of generating the filter output signal, computing the maximum can involve delaying receipt of the clipped portion of the input data signal by the moving average filter according to a group delay of the moving average filter to generate a delayed clipped portion, such that the maximum is computed with respect to the delayed clipped portion.

In some embodiments, at any particular time, the moving time window defines a temporal range that includes $2^N$ samples of the clipped portion of the input data signal, where N is a positive integer. In such embodiments, filtering the clipped portion of the input data signal at the particular time can include computing a sum of the $2^N$ samples of the filter input signal, and eliminating the N least-significant bits of the sum to obtain the average of the clipped portion of the input data signal for the particular time. For example, at any particular time, the filtering can average eight samples (i.e., where N equals three) by adding the eight samples and removing the three least significant bits, effectively dividing by eight.

At stage 716, embodiments can generate an output data signal by subtracting the filter output signal from the input data signal. In some embodiments, the subtracting generates a filter pre-output signal, and generating the output data signal at stage 716 can include computing a minimum of the filter pre-output signal with respect to the threshold peak level to generate the filter output signal. As described above, some embodiments involve adding delay to one or more signals. For example, generating the output data signal can involve delaying the input data signal according to at least a group delay of the moving average filter to generate a delayed input data signal, so that the output data signal is generated by subtracting the filter output signal from the delayed input data signal.

As described herein some embodiments can involve one or more types of iteration. In some such embodiments, generating the filter output signal at stage 712 can include iteratively filtering the clipped portion of the input data signal by receiving the clipped portion of the input data signal by the moving average filter in a first iteration (indicated by the solid arrow between stages 708 and 712), and receiving the filter output signal by the moving average filter in one or more subsequent iterations (indicated by dashed arrow "A"). In other such embodiments, generating the output data signal at stage 716 includes generating the output data signal in a first iteration by subtracting the filter output signal from the input data signal (indicated by the solid arrow between stages 712 and 716); and, in one or more subsequent iterations, generating the output data signal by clipping the output data signal with respect to the threshold peak level to obtain a clipped portion of the output data signal that exceeds the threshold peak level (indicated by dashed arrow "B"), regenerating the filter output signal by filtering the clipped portion of the output data signal by the moving average filter; and subtracting the regenerated filter output signal from the input data signal.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A crest factor reduction system comprising:
    an input node to receive an input data signal;
    an output node to output an output data signal;
    a clipper subsystem to generate, responsive to receiving a clipper input signal, a clipper output signal that is a clipped portion of the clipper input signal that exceeds a threshold peak level, the clipper subsystem having at least a first clipper mode in which the clipper subsystem is coupled with the input node, such that the clipper input signal is the input data signal;
    a filter subsystem to generate, responsive to receiving a filter input signal, a filter output signal that is a function of an average of the filter input signal over a moving time window, the filter subsystem having at least a first filter mode in which the filter subsystem is coupled with the clipper subsystem, such that the filter input signal is the clipper output signal, the filter subsystem comprising:
   a moving average filter to generate a moving average signal that is the average of the clipped portion of the filter input signal over the moving time window; and
   a maximum operation subsystem to receive the moving average signal and the filter input signal, and to generate the filter output signal by computing a maximum of the moving average signal with respect to the clipper output signal; and
an output signal generator to generate the output data signal at the output node by subtracting the filter output signal from the input data signal.

2. The system of claim 1, wherein the output signal generator further comprises:
a delay component to delay receipt of the input data signal according at least to a group delay of the filter subsystem to generate a delayed input data signal, such that the output data signal is generated by subtracting the filter output signal from the delayed input data signal.

3. The system of claim 1, wherein the filter subsystem further comprises:
a delay component to delay receipt of the clipper output signal according to a group delay of the moving average filter to generate a delayed clipped portion, such that the maximum is computed with respect to the delayed clipped portion.

4. The system of claim 1, wherein the maximum operation subsystem comprises a comparator having a first comparator input coupled with the moving average signal, a second comparator input coupled with the clipper output signal, and a comparator output that is the maximum of the first and second comparator inputs.

5. The system of claim 1, further comprising:
a state controller to direct a plurality of iterations, such that:
   in a first iteration, the state controller directs the filter subsystem to operate in the first filter mode, thereby coupling an input of the filter subsystem to an output of the clipper subsystem such that the filter input signal is the clipper output signal; and
   in a second iteration, the state controller directs the filter subsystem to operate in a second filter mode, thereby coupling the input of the filter subsystem to an output of the filter subsystem such that the filter input signal is the filter output signal.

6. The system of claim 1, wherein:
N is a positive integer;
at any of a plurality of times, the moving time window defines a temporal range that includes $2^N$ samples of the filter input signal; and
the filter subsystem comprises a time-domain box filter that computes, at each time of the plurality of times, the average of the filter input signal by computing a sum of the $2^N$ samples of the filter input signal, and eliminating N least-significant bits of the sum to obtain the average of the filter input signal for the time.

7. A method for crest factor reduction comprising:
receiving an input data signal;
clipping the input data signal with respect to a threshold peak level to obtain a clipped portion of the input data signal that exceeds the threshold peak level;
generating a filter output signal by:
   filtering the clipped portion of the input data signal by a moving average filter to generate a moving average signal that is the average of the clipped portion of the input data signal over the moving time window; and
   generating the filter output signal by computing a maximum of the moving average signal with respect to the clipped portion of the input data signal; and
generating an output data signal by subtracting the filter output signal from the input data signal.

8. The method of claim 7, wherein computing the maximum of the moving average signal with respect to the clipped portion of the input data signal comprises:
delaying receipt of the clipped portion of the input data signal by the moving average filter according to a group delay of the moving average filter to generate a delayed clipped portion,
wherein the maximum is computed of the moving average signal with respect to the delayed clipped portion.

9. The method of claim 7, wherein:
N is a positive integer;
at a particular time, the moving time window defines a temporal range that includes $2^N$ samples of the clipped portion of the input data signal; and
filtering the clipped portion of the input data signal at the particular time comprises computing a sum of the $2^N$ samples of the filter input signal, and eliminating N least-significant bits of the sum to obtain the average of the clipped portion of the input data signal for the particular time.

10. The method of claim 7, wherein generating the filter output signal further comprises iteratively filtering the clipped portion of the input data signal by the moving average filter by:
receiving the clipped portion of the input data signal by the moving average filter in a first iteration of a plurality of iterations; and
receiving the filter output signal by the moving average filter in each of at least a second iteration of the plurality of iterations.

11. The method of claim 7, wherein generating the output data signal further comprises:
delaying the input data signal according to at least a group delay of the moving average filter to generate a delayed input data signal,
wherein the output data signal is generated by subtracting the filter output signal from the delayed input data signal.

12. The method of claim 7, wherein generating the output data signal further comprises:
generating the output data signal in a first iteration of a plurality of iterations by subtracting the filter output signal from the input data signal; and
generating the output data signal in each of at least a second iteration of the plurality of iterations by:
clipping the output data signal with respect to the threshold peak level to obtain a clipped portion of the output data signal that exceeds the threshold peak level;
regenerating the filter output signal by filtering the clipped portion of the output data signal by the moving average filter; and
subtracting the regenerated filter output signal from the input data signal.

13. A transmitter system comprising:
a power amplifier to generate a transmission signal for transmission over a data channel as a function of applying gain to an output data signal, the power amplifier having an associated threshold peak level; and a crest factor reduction (CFR) system coupled with the power amplifier to generate the output data signal as a crest factor-reduced version of a received input data signal in accordance with the threshold peak level, the CFR system comprising:

means for clipping the input data signal with respect to the threshold peak level to generate a clipped portion of the input data signal;

means for edge-smoothing the clipped portion of the input data signal by computing a moving average of the clipped portion of the input data signal over a moving time window and computing a filter output signal as a maximum of the moving average with respect to the clipped portion of the input data signal; and means for generating the output data signal as a function of subtracting the filter output signal from the input data signal.

* * * * *